United States Patent
Laermer et al.

(10) Patent No.: US 7,648,611 B2
(45) Date of Patent: Jan. 19, 2010

(54) PLASMA ETCHING EQUIPMENT

(75) Inventors: Franz Laermer, Weil der Stadt (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/276,438

(22) PCT Filed: May 10, 2001

(86) PCT No.: PCT/DE01/01778

§ 371 (c)(1), (2), (4) Date: Apr. 4, 2003

(87) PCT Pub. No.: WO01/88962

PCT Pub. Date: Nov. 22, 2001

(65) Prior Publication Data

US 2004/0014325 A1 Jan. 22, 2004

(30) Foreign Application Priority Data

May 19, 2000 (DE) ................................. 100 24 883

(51) Int. Cl.
  H01L 21/306 (2006.01)
  C23C 16/00 (2006.01)
(52) U.S. Cl. ............................. 156/345.48; 118/723 I; 315/111.51
(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| 5,289,010 | A | | 2/1994 | Shohet |
| 5,336,366 | A | | 8/1994 | Cain et al. |
| 5,556,501 | A | * | 9/1996 | Collins et al. ........... 156/345.38 |
| 5,753,886 | A | | 5/1998 | Aoki et al. |
| 5,916,455 | A | * | 6/1999 | Kumagai ...................... 216/68 |
| 6,016,131 | A | | 1/2000 | Sato et al. |
| 6,162,323 | A | * | 12/2000 | Koshimizu ............. 156/345.26 |
| 6,203,657 | B1 | * | 3/2001 | Collison et al. ......... 156/345.48 |
| 6,352,049 | B1 | * | 3/2002 | Yin et al. ............... 118/723 MP |
| 6,463,875 | B1 | * | 10/2002 | Chen et al. ................. 118/723 I |

FOREIGN PATENT DOCUMENTS

DE 42 41 045 5/1994

(Continued)

*Primary Examiner*—Luz L. Alejandro
(74) *Attorney, Agent, or Firm*—Kenyon & Kenyon LLP

(57) ABSTRACT

A plasma etching system for etching, in particular anisotropic etching, of a substrate by using a plasma. The plasma etching system has a first plasma-generating device which is inductively coupled in particular and has a first arrangement for generating a first high-frequency electromagnetic alternating field, a first plasma-generating area for generating a first plasma and a first gas feed, as well as a first plasma-generating device downstream from a second plasma-generating device which is inductively coupled in particular and has a second arrangement for generating a second high-frequency electromagnetic alternating field, a second plasma-generating area for generating a second plasma and a second gas feed. The substrate to be etched is arranged in the first plasma-generating device. The second plasma is suppliable to the first plasma-generating device via the first gas feed at least partially as a first reactive gas.

15 Claims, 1 Drawing Sheet

FOREIGN PATENT DOCUMENTS

| | | |
|---|---|---|
| DE | 197 34 278 | 2/1999 |
| DE | 199 00 179 | 2/2000 |
| EP | 0 849 766 | 6/1998 |
| EP | 0 964 424 | 12/1999 |
| WO | WO 99 40609 | 8/1999 |
| WO | WO 00/36631 | 6/2000 |

* cited by examiner

PLASMA ETCHING EQUIPMENT

FIELD OF THE INVENTION

The present invention relates to a plasma etching system in particular for anisotropic etching of a substrate using a plasma.

BACKGROUND OF THE INVENTION

A silicon high-rate etching process where silicon is etched using inductive plasma excitation is discussed in German Published Patent Application No. 42 41 045. To achieve as high as possible etching rates it may be required to provide an as high as possible concentration of fluorine radicals in the plasma produced. This may occur via irradiation of an appropriately high high-frequency power, having power values between 3 and 6 kW, into the inductive plasma source under simultaneously increased process pressure of 30 to 100 μbar, or up to 250 μbar if the required uniformity of the plasma produced permits this. However, an undesirable ion density may appear in such processes along with a desired increase in the fluorine radical density and these ions may interfere with the actual etching process and may be detrimental to a sufficiently high mask selectivity. These ions heat up the wafer to be etched, resulting in profile deviations. By using a suitable device in the plasma etching system it may be subsequently ensured that the density of the ions produced is reduced to acceptable low values and it may be homogenized. In this connection it has been proposed that a recombination of ions and electrons be made possible by using diffusion paths or at aperture constructions, according to German Published Patent Application No. 197 34 278 for example. The portion of the high frequency power injected into the plasma which was used to generate an undesirably high ion density may be lost here in the form of heat or radiation.

Although other prior devices for the reduction of the ion density may be successful, in practice there may still appear, in particular in the margin area of the substrate to be etched, profile deviations, profile asymmetries, etching rate excesses, or regular or irregular profile undercuts, which may be referred to as "beaking" effects and which may not be tolerable in many applications.

In other prior devices for the reduction of the ion density it may be a problem in particular that an ion density in excess by one to two orders of magnitude may be required to be applied completely homogeneously to the desired area over the entire surface to be etched, having, for example, a diameter of 150 mm or 200 mm, without thereby causing distortions of the plasma potential on the surface of the substrate to be etched. Due to such distortions of the plasma potential, excessive local ion densities and/or excessive local ion energies may result there in the above-mentioned detrimental effects.

German Published Patent Application No. 199 00 179 further refers to a plasma etching system for high-rate etching of silicon using inductive plasma excitation in which the plasma source, having a balanced supply of the inductive excitation inductor, is provided. Such a plasma etching system, having a symmetrically configured adapting network for adapting the impedance of the injected high frequency power to the impedance of the plasma produced and the simultaneously balanced supply of the inductive excitation inductor may result in a minimal injection of undesired displacement currents into the plasma and thus in minimal distortions of the plasma. Such a symmetrical inductor supply may be desirable at high power values of more than 3 kW.

SUMMARY OF THE INVENTION

The plasma etching system according to an exemplary embodiment of the present invention may provide that in the upper part of the reactor chamber, which may be used as a second plasma-generating device, in the case of a process according to German Published Patent Application No. 42 41 045, a high-density plasma may be generated, having a high density of etch species and passivation species and excessively high ion densities and undesirable plasma potential interruptions and inhomogeneities in the initially produced second plasma may be removed so that, in passing through the first gas feed which in particular may be simultaneously used as a discharge device, these ions at least may largely recombine with electrons, so that the ion density of the reactive gas supplied to the downstream first plasma-generating device may be virtually zero or may be negligible. Thus, density inhomogeneities and potential inhomogeneities may be also eliminated.

Furthermore, by using the plasma etching system according to an exemplary embodiment and/or exemplary method of the present invention, the ion density required for the actual etch process may then be redefined and newly generated in a first plasma-generating device in which the substrate to be etched may also be arranged.

This first plasma-generating device may be operated with noticeably less power than the second plasma-generating device, so that, thanks to this lower power, the ion generation in this first plasma-generating device may occur homogeneously and free of disturbances or plasma potential distortions. Thus, by using the plasma etching system according to an exemplary embodiment and/or exemplary method of the present invention, it may be achieved overall that the ion density appearing in the second plasma-generating device is initially set at zero, and that, starting at zero, this ion density may be subsequently homogeneously and actively built up again to the desired value for the actual etching process by using the first plasma-generating device.

In addition, the plasma etching system according to an exemplary embodiment and/or exemplary method of the present invention may be implementable without great effort by modification or addition of already present, in particular inductively coupled, plasma systems, without incurring high investment costs.

Both the first plasma-generating device and the second plasma-generating device may be inductively coupled plasma-generating devices, which may each be provided with an ICP (inductively coupled plasma) inductor as a plasma source.

Furthermore, the first plasma-generating device and the second plasma-generating device may be connected to one another via a gas-permeable and in particular grounded discharging device which may cause the discharge of the ions and/or electrons originating in the second plasma and which may be simultaneously used as a first gas feed to the first plasma-generating device. For this purpose, this discharging device or gas feed may be configured as an ion filter in the form of a metallic perforated plate, a fine metallic mesh, a metallic or ceramic perforated plate, as a gas feed ring, which connects the first plasma-generating device with the second plasma-generating device, or as a construction referred to as a "showerhead" construction, which may be placed inside the reactor vessel, e.g. approximately at half-height where it may divide the vessel into two approximately equal spaces, the first of which may be assigned to the first plasma-generating device and the second may be assigned to the second plasma-generating device. Instead of being made of metal or ceramic, the discharging device may also be made of a different dielectric material.

The discharging device may be configured as a metallic mesh which may reduce the effective gas passage area for a gas from the second plasma-generating device into the first plasma-generating device to 0.01% to 80% of the passage area between the plasma-generating devices present in the reactor chamber without the discharging device.

In addition, the discharging device, i.e., the first gas feed, may also be utilized to generate a higher process pressure in the second plasma-generating device, upstream from the first plasma-generating device, than in the downstream first plasma-generating device. The process pressure difference may be adjustable in a simple manner via the effective gas passage area of the discharging device or via the first gas feed and thus its flow resistance. Due to the higher process pressure in the second plasma-generating device, more radicals may be initially generated there from the second reactive gas fed thereto than is the case at a lower pressure, since the process pressure may facilitate a shift of the equilibrium in the formation of radicals and ions from the reactive gas toward radical formation.

This pressure increase in the second plasma-generating device inevitably may result in a considerably more inhomogeneous ion distribution in the second plasma produced. However, this may not be prejudicial since the downstream discharging device may eliminate or recombine at least almost all ions anyway. Simultaneously a relatively low pressure may prevail in the downstream first plasma-generating device, which may provide the additional feature that ions having an especially uniform ion distribution are generated there and that the interaction between the first plasma produced there and the substrate to be etched produces particularly homogeneous etching results over the entire surface of the substrate.

Furthermore, the lower process pressure in the first plasma-generating device may result in an increased ion formation compared to radical formation. This may also, however, not be detrimental or prejudicial, since the desired radicals for the etching process may be generated from the second reactive gas to a substantially larger extent in the upstream second plasma-generating device which may be operated with higher process pressure and higher power.

Overall, plasma generation may occur under optimum pressure conditions with regard to ion and radical formation in both plasma-generating devices via the process pressure difference which may be adjustable in a defined manner by using the discharging device or the first gas feed. The mass flow density ($\rho$ v) for the radicals generated, i.e., the process variable which may largely determine the etching rates achieved, may remain unchanged due to the pressure reduction from the second to the first plasma-generating device.

In summary, by using the discharging device provided between the first plasma-generating area and the second plasma-generating area, initially an at least extensive recombination of ions and electrons may be accomplished via a plasma wall interaction during the passage of the reactive gas coming from the second plasma-generating device, which may be ionized and interspersed with radicals. The reactive gas discharged in such a manner may then be fed to the first plasma-generating device as a first reactive gas and may be re-ionized there. Thus it may be achieved that directly below the discharging device the first reactive gas may now contain only radicals and no more ions, so that inhomogeneities of the originally generated ion density distribution may also be eliminated there. A certain pressure difference, i.e., a pressure gradient between the two plasma-generating devices, may also be adjustable.

If it is made of metal, the discharging device may also represent a reference ground for the first plasma in the first plasma-generating device, so that a certain reference potential may be provided for the electrical processes taking place there. Plasma potential inhomogeneities, stemming from the originally generated second plasma, may also be eliminated at the location of the discharging device and may be replaced with a defined ground potential over the entire surface.

It is a further feature of the metallic discharging device that the high-frequency alternating fields of the second ICP inductor in the second plasma-generating device may be shielded from the first plasma-generating device and thus may prevent them from penetrating into the lower part of the reactor chamber. This may ensure that the tendency of creating inhomogeneities and plasma disturbances, present on the second ICP inductor due to the high power applied there, may not extend to the lower part of the reactor chamber, i.e., the first plasma-generating area, which is thus operated disturbance-free to the maximum possible extent.

Thus, the first ICP inductor in the first plasma-generating area now may only have the function in this lower part of the reactor chamber of rebuilding the ion concentration actually required for the anisotropic etching process performed, for which a small power may be sufficient for ion generation, in particular under a desired process pressure. By using the plasma etching system according to an exemplary embodiment and/or exemplary method of the present invention reactive gas species may be produced in the form of radicals in the second plasma-generating device using high-frequency power of, for example, 3 kW to 6 kW and an increased process pressure compared to the downstream first plasma-generating device. The radicals may then be fed to the first plasma-generating area, where, with the aid of a first ICP inductor, a first plasma may be maintained which may serve only the purpose of ensuring an ion density required for the etching process according to German Published Patent Application No. 42 41 045, for example, for which a power of 400 W to 1,000 W may be sufficient. The pressure difference between the two plasma-generating devices may be between 10 µbar and 250 µbar, in particular between 30 µbar and 70 µbar.

The first gas feed, i.e., discharging device, may be heatable in order to prevent deposit buildup thereon.

A selection may be made between two exemplary embodiments for injection of high-frequency power into the first ICP inductor and the second ICP inductor.

Each of the two ICP inductors may have a separate high-frequency component including a high-frequency generator of its own and an associated interface network for matching the impedance of the respective plasma-generating device to the impedance of the respective plasma. In this case, a high-frequency generator having a large power range of, e.g., 6 kW may be suitable for the second plasma, while a smaller high-frequency generator having a power range of, e.g., 1,000 W may be sufficient for the first plasma. In order to prevent intensity pulsations in the generated plasmas, both high-frequency generators may be operated phase-locked at a common frequency of 13.56 MHz, for example, or two separate high-frequency generators may be utilized having two different frequencies of, e.g., 13.56 MHz for the second ICP inductor and 12.56 MHz, 2 MHz, or 380 kHz for the first ICP inductor.

Since the operation of two separate high-frequency generators having two associated interface networks in one and the same plasma etching system may represent a substantial cost factor, an alternative exemplary embodiment of the present invention provides for the first plasma-generating device and the second plasma-generating device to be operated using a common high-frequency component having a common high-frequency generator and a common interface network. The feed of an ICP inductor in a plasma etching system via a symmetrically configured interface network and a symmetrically configured inductor supply, referred to in German Published Patent Application No. 199 00 179, may be used here. However, due to the presence of two ICP inductors the inductor supply may be required to be modified in such a manner that the first ICP inductor is connected in parallel to a section of the second ICP inductor at two taps, which may be symmetrically positioned in relation to a center tap of the ICP inductor.

In this manner it may be achieved that, in the electrical sense, the first ICP inductor acts as a shunt on the second ICP inductor, i.e., it carries a more or less sizable portion of the entire inductor current. In particular, through defined selection or displacement of the position of the two symmetrical taps on the second ICP inductor it may be determined in a simple manner the portion of the inductor current which flows through the first ICP inductor and thereby the split of the inductor currents and the associated high-frequency power injected into the first and second plasmas.

A plasma etching system according to German Published Patent Application No. 199 00 179 may be modified so that henceforth two ICP inductors are provided, one of which is connected in parallel to a section of the other, so that the arrangement of both inductors is to be understood as a series-parallel circuit of inductances which in turn form an overall inductance L. This interconnection of the ICP inductors may also facilitate an impedance match via a sole interface network, the high high-frequency power, injected into the second ICP inductor, being operated with low high-frequency power, merely follows. In particular, since it may be adjusted in resonance overall as part of an LC system, this first ICP inductor may then also be properly matched to the plasma with regard to its impedance.

In summary, also in this interconnection of the ICP inductors, the first plasma-generating device may have essentially only the function of causing controlled ionization of the reactive gas from the second plasma-generating device composed of neutral radicals and unreacted process gases, i.e., reactive gases, for which only a small part of the total high-frequency power, supplied to the second ICP inductor, may be sufficient. Since the second ICP inductor may also be symmetrically operated, based on the inductor supply as discussed in German Published Patent Application No. 199 00 179 modified in the described manner, the ionization of the reactive gas in the first plasma-generating device may occur in a particularly homogeneous and disturbance-free manner, i.e., especially free of capacitive injection of displacement currents.

It should also be noted that for the purpose of further homogenization of the plasma inductance and further reduction of profile deviations, i.e., excessive etching rates in the first plasma-generating device, an aperture may be provided as is discussed in German Patent Application 197 34 278 for example. In addition, it may be advantageous for certain applications if the plasma generation in the first plasma-generating device and/or in the second plasma-generating device is additionally supported by using a magnetic field.

DETAILED DESCRIPTION

The present invention is first directed to a plasma etching system, in principle referred to in German Published Patent Application No. 199 00 197, which is modified, as is explained below.

By using this modified plasma etching system, an anisotropic plasma etching process for silicon may be subsequently performed, as is discussed in German Published Patent Application No. 42 41 045.

Figure 1:
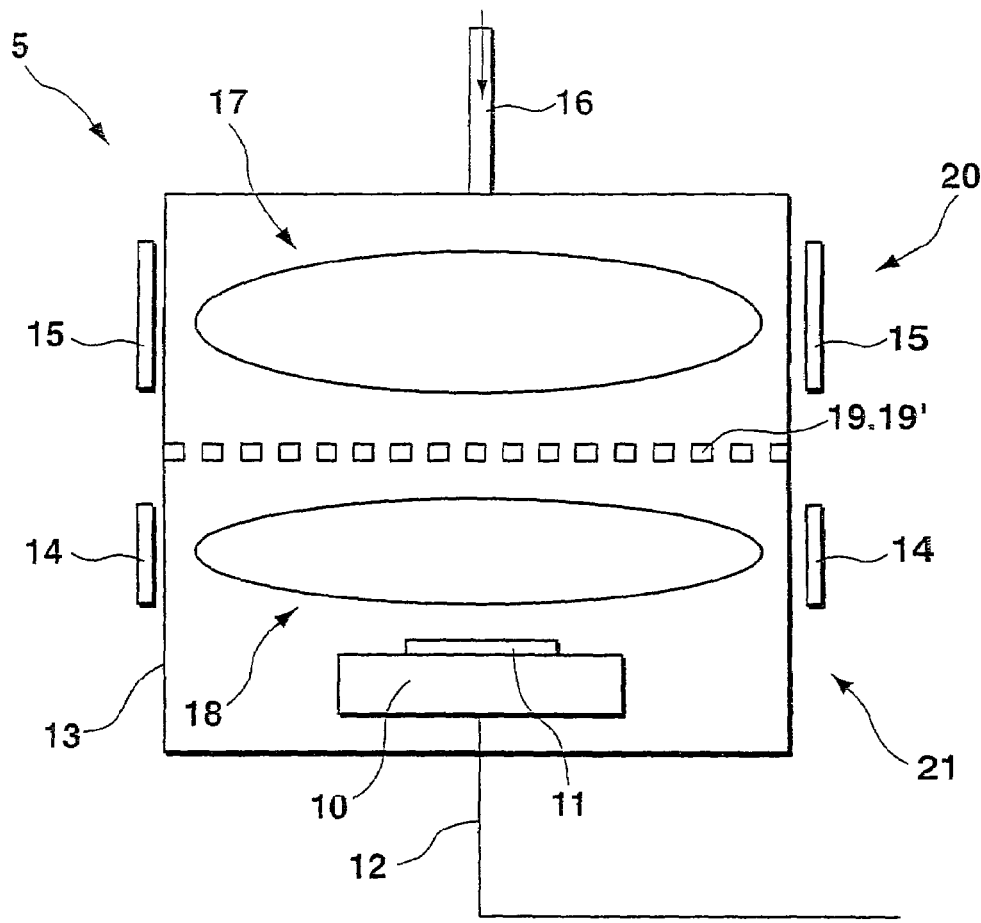
FIG. 1 shows a sectional view of a schematic diagram of a plasma etching system according to an exemplary embodiment of the present invention.

In particular, plasma etching system 5 according to FIG. 1 has a reactor chamber 13, which is divided into two approximately even-sized areas by a discharging device 19', which are assigned to a first plasma-generating device 21 in the lower part of reactor chamber 13 and to a second plasma-generating device 20 in the upper part of reactor chamber 13. Furthermore, reactor chamber 13 has a second gas feed 16 to a second plasma-generating area 17 and a first gas feed 19 to a first plasma-generating area 18.

First gas feed 19 is configured in the form of a metallic mesh which reduces the gas passage area between first plasma-generating device 21 and second plasma-generating device 20 to approximately 0.01% to 80% of the cross sectional area of reactor chamber 13 at this point. In particular, first gas feed 19 is simultaneously used as discharging device 19' and as a flow resistor for adjustment of a pressure difference $\Delta p$ between first and second plasma-generating device 20, 21. In the presently explained example this pressure difference amounts to 10 μbar to 100 μbar, such as, for example, 50 μbar.

According to FIG. 1, first plasma-generating device 21 and second plasma-generating device 20 have an associated first ICP inductor 14 and an associated second ICP inductor 15, respectively. In the case of both plasma-generating devices 20, 21 these are inductively coupled plasma-generating devices in which, with the aid of ICP inductors 14, 15, a high-frequency electromagnetic alternating field is generated, which ignites, i.e., operates, a plasma in first plasma-generating area 18 and in second plasma-generating area 17 by acting upon reactive particles from a supplied reactive gas.

Furthermore, FIG. 1 shows that a substrate electrode 10, having a substrate 11, for example a silicon wafer to be etched positioned on it, is arranged inside first plasma-generating device 21. In addition, substrate electrode 10 is connected via a duct 12 to a high-frequency generator (not shown) using which a substrate electrode voltage is injectable into substrate electrode 10. In this manner it may be ensured that ions which are present or have been generated in first plasma-generating area 18 are accelerated in the direction of substrate 11.

Using plasma etching system 5 the anisotropic etching process for silicon, referred to in German Published Patent Application No. 42 41 045, is performed, in that etching steps and passivation steps are performed alternately during the etching process and fluorine radicals are formed from fluorine-delivering gas, for example, sulphur hexafluoride, and during the passivation steps, polymerizeable radicals, for example $(CF_2)_n$, are formed from a gas which forms teflon-like films, for example, $C_4F_8$. In order to suppress harmful sulphur precipitations in the exhaust gas area of plasma etching system 5, this process may be performed using an addition of 10% to 20% oxygen to the sulphur hexafluoride flow during the etching steps.

In order to generate an etching rate which is as high as possible in silicon and a density of fluorine radicals which is as high as possible during the etching steps and also densities of teflon-like films which are as high as possible during the passivation steps, a plasma power of 3 kW to 7 kW may be injected under increased process pressure of 30 μbar to 250 μbar, such as, for example, 40 μbar to 100 μbar via second plasma-generating device 20, i.e., second ICP inductor 15, into the plasma generated there.

First ICP inductor 14, i.e., first plasma-generating device 21, is then operated using an essentially lower injected high-frequency power of, e.g., 400 W to 1,000 W and a process pressure lower by Δp as compared to second ICP inductor 15. In particular, the process pressure in the first plasma-generating device amounts to 5 μbar to 30 μbar, such as, for example, to 10 μbar.

In the case of plasma etching system 5 according to FIG. 1, both first ICP inductor 14 and also second ICP inductor 15 are connected via appropriate power leads to a common high-frequency component (not shown) having a common high-frequency generator and a common interface network 25. This is explained in greater detail on the basis of FIG. 2.

Figure 2:
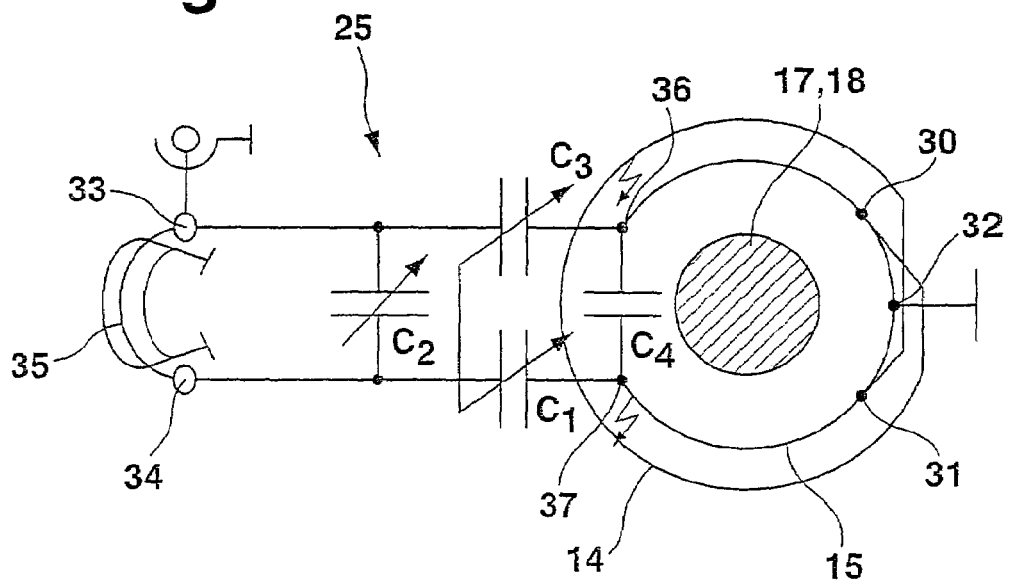
FIG. 2 shows a common interface network for supplying both ICP inductors 14, 15 in the plasma etching system according to FIG. 1.

FIG. 2 shows a schematic diagram of a common interface network 25, where first ICP inductor 14 and second ICP inductor 15 are illustrated in a top view according to FIG. 1. It should be noted in particular that reactor chamber 13 according to FIG. 1 has a cylindrical configuration, and this reactor chamber 13 is enclosed in certain areas by first ICP inductor 14 and second ICP inductor 15.

First, common interface network 25 has a first feed point 33 at which a high-frequency power of 3 kW to 7 kW having a frequency of 13.56 MHz is injectable from the common high-frequency generator (not shown) into common interface network 25 via an asymmetrical coaxial lead having an impedance of 50 Ω. Furthermore, this first feed point 33 is connected to a second feed point 33 via a delay line 35. In a manner discussed in German Published Patent Application No. 199 00 179, delay line 35 may ensure a phase shift of λ/2 of the high-frequency power injected at first feed point 33 compared to second feed point 34.

Thus, a high-frequency alternating voltage having the same frequency and, with regard to its absolute value, at least approximately the same amplitude, is applied to both feed points 33, 34 which are phase shifted against one another by 180°. The impedance between feed points 33, 34 amounts to 200 Ω.

Furthermore, according to FIG. 2, common interface network 25 has a total of 4 capacitors $C_1$, $C_2$, $C_3$, and $C_4$, with which the impedance of 200 Ω between feed points 33, 34 and the impedance of the plasma in first plasma-generating area 18 and in second plasma-generating area 17 may be matched. This impedance match may be important for second plasma-generating area 17, due to the high-frequency power injected into second plasma-generating area 17.

According to FIG. 2, the injected high-frequency power is then injected into second ICP inductor 15 at a first inductor end 36 and at a second inductor end 37. ICP inductor 15 may have a center tap 32 and may also be grounded. In addition, second ICP inductor 15 has a first tap 30 and a second tap 31 which are symmetrically positioned with regard to center tap 32. Second ICP inductor 15 is connected, via first tap 30 and second tap 31, to first ICP inductor 14, which is thus connected in parallel to the part of second ICP inductor 15 which is arranged between both taps 30 and 31.

With regard to further details of the function and the configuration of the individual components of common interface network 25, reference is made to German Published Patent Application No. 199 00 179 where this circuit is described.

It should be noted in particular that according to FIG. 2 first ICP inductor 14 is operated shunted to a part of second ICP inductor 15 so that a symmetrical and balanced supply to both inductors 14 and 15 may be ensured. Moreover, the supply may be regulatable in a simple manner.

What is claimed is:

1. A plasma etching system for etching a substrate by an action of a plasma, comprising:
   a first gas feed;
   a first plasma-generating device having a first arrangement to generate a first high-frequency electromagnetic alternating field, and a first plasma-generating area to generate a first plasma from reactive particles using the first high-frequency electromagnetic alternating field to act upon a first reactive gas, the substrate being arranged in the first plasma-generating device;
   a second gas feed;
   a second plasma-generating device arranged upstream from the first plasma-generating device having a second arrangement to generate a second high-frequency electromagnetic alternating field, and a second plasma-generating area to generate a second plasma from reactive particles using the second high-frequency electromagnetic alternating field to act upon a second reactive gas, the second plasma being suppliable to the first plasma-generating device via the first gas feed at least partially as the first reactive gas;
   a second ICP inductor having a first tap, a second tap, a first inductor end and a second inductor end; and
   a first ICP inductor electrically connected in parallel to only a subsection of the second ICP inductor via the first tap and the second tap;
   wherein the first plasma-generating device and the second plasma-generating device have a common high-frequency component having a common high-frequency generator and a common interface network;
   wherein the second ICP inductor has a grounded center tap, the first tap and the second tap being symmetrically positioned thereto;
   wherein the first tap is situated on the second ICP inductor between the center tap and the first inductor end, and the second tap is situated on the second ICP inductor between the center tap and the second inductor end.

2. The plasma etching system of claim 1, wherein the system is configured to perform anisotropic etching.

3. The plasma etching system of claim 1, further comprising:
   a lead; and
   a high frequency power source;
   wherein the first plasma-generating device includes a substrate electrode connected to the high-frequency voltage source via the lead, by which ions contained in the first plasma are acceleratable toward the substrate.

4. The plasma etching system of claim 1, wherein the first gas feed is configured to be used as a gas permeable discharging device to connect the first plasma-generating device to the second plasma-generating device, the gas permeable discharging device configured to cause at least partial discharge of at least one of ions and electrons from the second plasma.

5. The plasma etching system of claim 4, wherein the gas permeable discharging device is grounded.

6. The plasma etching system of claim 4, wherein the gas permeable discharging device includes at least one of a metallic perforated plate, a ceramic perforated plate, a metallic mesh, a ceramic mesh, a showerhead, and a gas feed ring.

7. The plasma etching system of claim 4, further comprising:
a common reactor chamber to arrange the first and the second plasma-generating devices in tandem and separated from one another by the gas permeable discharging device so that the first reactive gas, being supplied to the first plasma-generating device, penetrates almost completely through the gas permeable discharging device.

8. The plasma etching system of claim 7, wherein the gas permeable discharging device is arranged in the common reactor chamber so that it reduces a gas passage area for a gas from the second plasma-generating device into the first plasma-generating device to 0.01% to 80% of the passage area between plasma-generating devices present in the common reactor chamber without the gas permeable discharging device.

9. The plasma etching system of claim 4, wherein the gas permeable discharging device is heatable.

10. The plasma etching system of claim 1, wherein an electric current is configured to flow through the first ICP inductor and through the section of the second ICP inductor, and a power injected into the first and the second plasma, is adjustable by taking into account a position of the first and the second taps.

11. The plasma etching system of claim 1, wherein the common interface network is a symmetrically configured interface network having a symmetrically configured inductor supply.

12. The plasma etching system of claim 1, wherein a pressure in the second plasma-generating device is higher than in the first plasma-generating device.

13. The plasma etching system of claim 1, wherein a pressure in the second plasma-generating device is 10 µbar to 250 µbar higher than in the first plasma-generating device.

14. The plasma etching system of claim 1, wherein a pressure in the second plasma-generating device is between 30 µbar and 250 µbar and a pressure in the first plasma-generating device is between 5 µbar and 30 µbar.

15. The plasma etching system of claim 1, wherein a pressure difference between the first plasma-generating device and the second plasma-generating device is adjustable via the first gas feed and the second gas feed.

* * * * *